US008242803B2

(12) United States Patent
Wu et al.

(10) Patent No.: US 8,242,803 B2
(45) Date of Patent: Aug. 14, 2012

(54) HDMI AND DISPLAYPORT DUAL MODE TRANSMITTER

(75) Inventors: Hai Jie Wu, Singapore (SG); Yow Ching Cheng, Singapore (SG)

(73) Assignee: Broadcom Corporation, Irvine, CA (US)

( * ) Notice: Subject to any disclaimer, the term of this patent is extended or adjusted under 35 U.S.C. 154(b) by 470 days.

(21) Appl. No.: 12/457,986

(22) Filed: Jun. 26, 2009

(65) Prior Publication Data

US 2010/0328540 A1 Dec. 30, 2010

(51) Int. Cl.
*H03K 19/003* (2006.01)

(52) U.S. Cl. .......................................... 326/30; 348/723

(58) Field of Classification Search ........................ None
See application file for complete search history.

(56) References Cited

U.S. PATENT DOCUMENTS

| | | | | |
|---|---|---|---|---|
| 7,212,028 | B2 * | 5/2007 | Shibata et al. | 326/30 |
| 7,679,395 | B1 * | 3/2010 | Yang et al. | 326/27 |
| 8,023,572 | B2 * | 9/2011 | Hailey | 375/258 |
| 2007/0257923 | A1 * | 11/2007 | Whitby-Strevens | 345/520 |
| 2008/0061837 | A1 * | 3/2008 | Xu et al. | 326/127 |

OTHER PUBLICATIONS

"VESA DisplayPort Standard", Video Electronics Standards Association, Version 1, Revision 1a, Jan. 11, 2008, 238 pgs.
Hitachi, Ltd. et al, "High-Definition Multimedia Interface Specification", HDMI Licensing, LLC, Version 1.3a, Nov. 10, 2006, 276 pgs.

* cited by examiner

*Primary Examiner* — Shawki S Ismail
*Assistant Examiner* — Crystal L Hammond
(74) *Attorney, Agent, or Firm* — Sterne, Kessler, Goldstein & Fox PLLC

(57) ABSTRACT

A method and apparatus is disclosed that is capable of transmitting video signals and/or audio signals using the HDMI interface standard or the DisplayPort interface standard. A dual mode transmitter is disclosed that is configurable to transmit to a first sink device, configured in accordance with a HDMI display interface, in a HDMI mode of operation and/or a second sink device, configured in accordance with a DisplayPort display interface, in a DisplayPort mode of operation. The dual mode transmitter is configured to receive a biasing current from the first sink device in the HDMI mode of operation or to internally provide the biasing current in DisplayPort mode of operation by selecting impedances from selectable impedance networks. The dual mode transmitter is configured to transmit the video signals and/or audio signals by biasing one or more transistors using the biasing current.

26 Claims, 10 Drawing Sheets

HDMI AND DISPLAYPORT DUAL MODE TRANSMITTER

FIELD OF THE INVENTION

The present invention relates generally to a communications transmitter and specifically to a single communications transmitter that is capable of transmitting data using multiple interface standards.

BACKGROUND

High-Definition Multimedia Interface (HDMI) is currently used in several hundred million digital televisions and other consumer electronics that incorporate digital video and/or audio, such as game consoles, digital-video-disc (DVD) players, Blu-ray-disc players, and digital-set-top boxes. HDMI is a first single cable solution for transmission of uncompressed digital video signals using any suitable television or personal computer (PC) video format, including standard, enhanced, and high-definition video and/or audio signals using any suitable television and/or PC audio format from a source device to a sink device.

DisplayPort was developed to address computing-world concerns and replace the external, box-to-box, analog-video-graphics-array (VGA) interfaces in PC and LCD monitors, as well as in consumer electronics, but it also targets the external digital-visual-interface (DVI) found mostly in consumer electronics systems. DisplayPort is a second single cable solution for transmission uncompressed of video signals using any suitable television or PC video format and/or audio signals using any suitable television or PC audio format from the source device to the sink device.

HDMI is mainly used in the high definition consumer electronics market, such as an external interface for high-definition televisions to provide an example. DisplayPort, on the other hand, is a a general-purpose internal and external display interface aimed at the computer industry. Both HDMI and DisplayPort are used for the transmission of video signals and/or audio signals from the source device to the sink device. With the gradual convergence of high definition consumer electronics market and the computer industry, manufacturers will like to design source devices that are capable of transmitting the video signals and/or the audio signals using either HDMI and DisplayPort. However, HDMI and DisplayPort both transmit the video signals and/or the audio signals in differing ways. As a result of these differences, a typical HDMI source device includes a HDMI transmitter that is solely configured according to the HDMI interface standard. Likewise, a typical DisplayPort source device includes a DisplayPort transmitter that is solely configured according to the DisplayPort interface standard. Presently, to design a source device that transmits according to the HDMI interface standard and the DisplayPort interface standard, manufacturers design source devices with separate transmitters, one transmitter configured for HDMI and another separate transmitter configured for DisplayPort. These separate transmitters increase a cost and/or size of the source device.

Therefore, what is needed is a source device having a single transmitter that is capable of transmitting video signals and/or audio signals using either the HDMI interface standard or the DisplayPort interface standard.

BRIEF DESCRIPTION OF THE DRAWINGS/FIGURES

The present invention is described with reference to the accompanying drawings. In the drawings, like reference numbers indicate identical or functionally similar elements. The left most digit(s) of a reference number identifies the drawing in which the reference number first appears.

Figure 7:
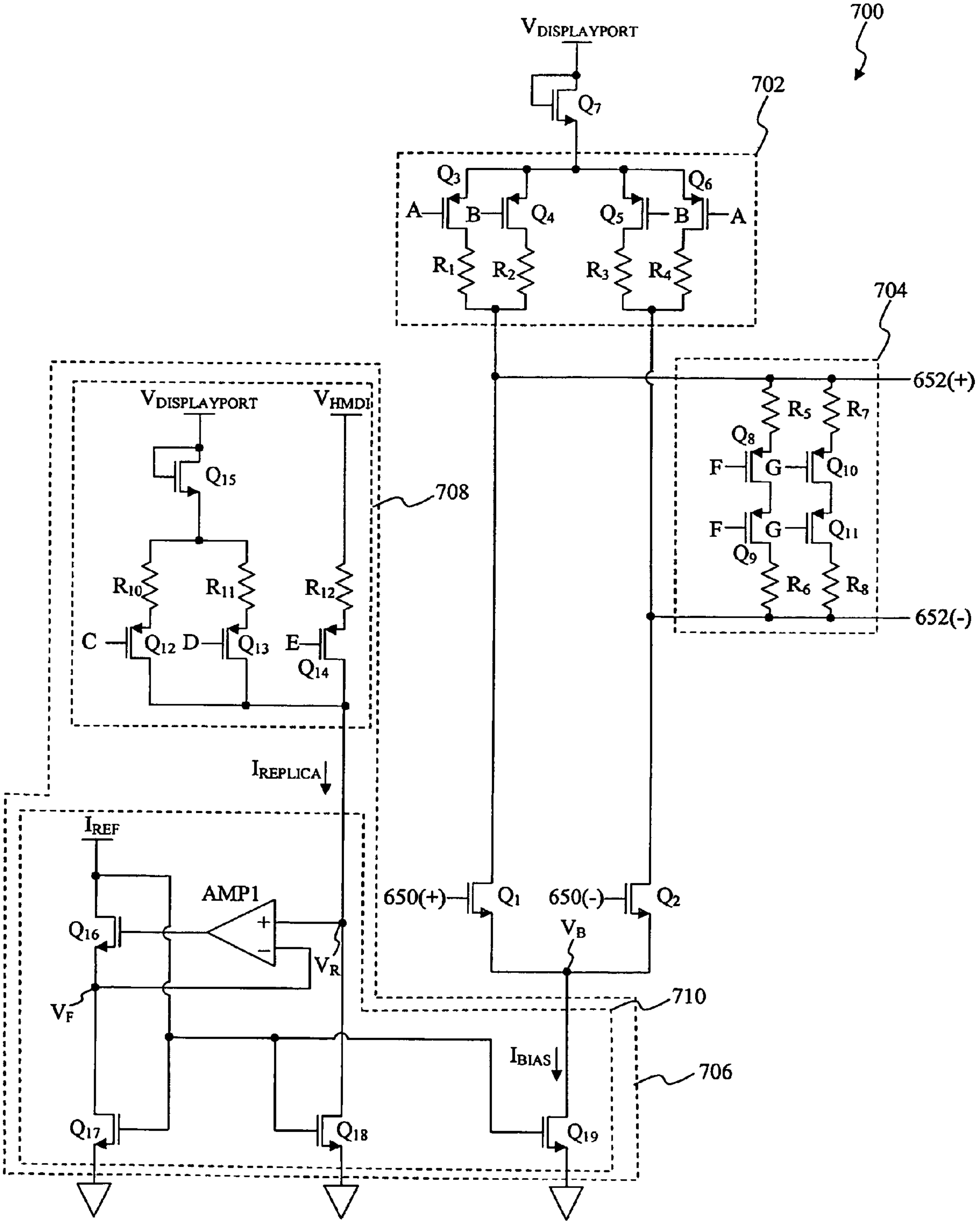

FIG. 7 further illustrates the HDMI/DisplayPort transmitter used in the Dual HDMI/DisplayPort system architecture according to an exemplary embodiment of the present invention.

Figure 8:
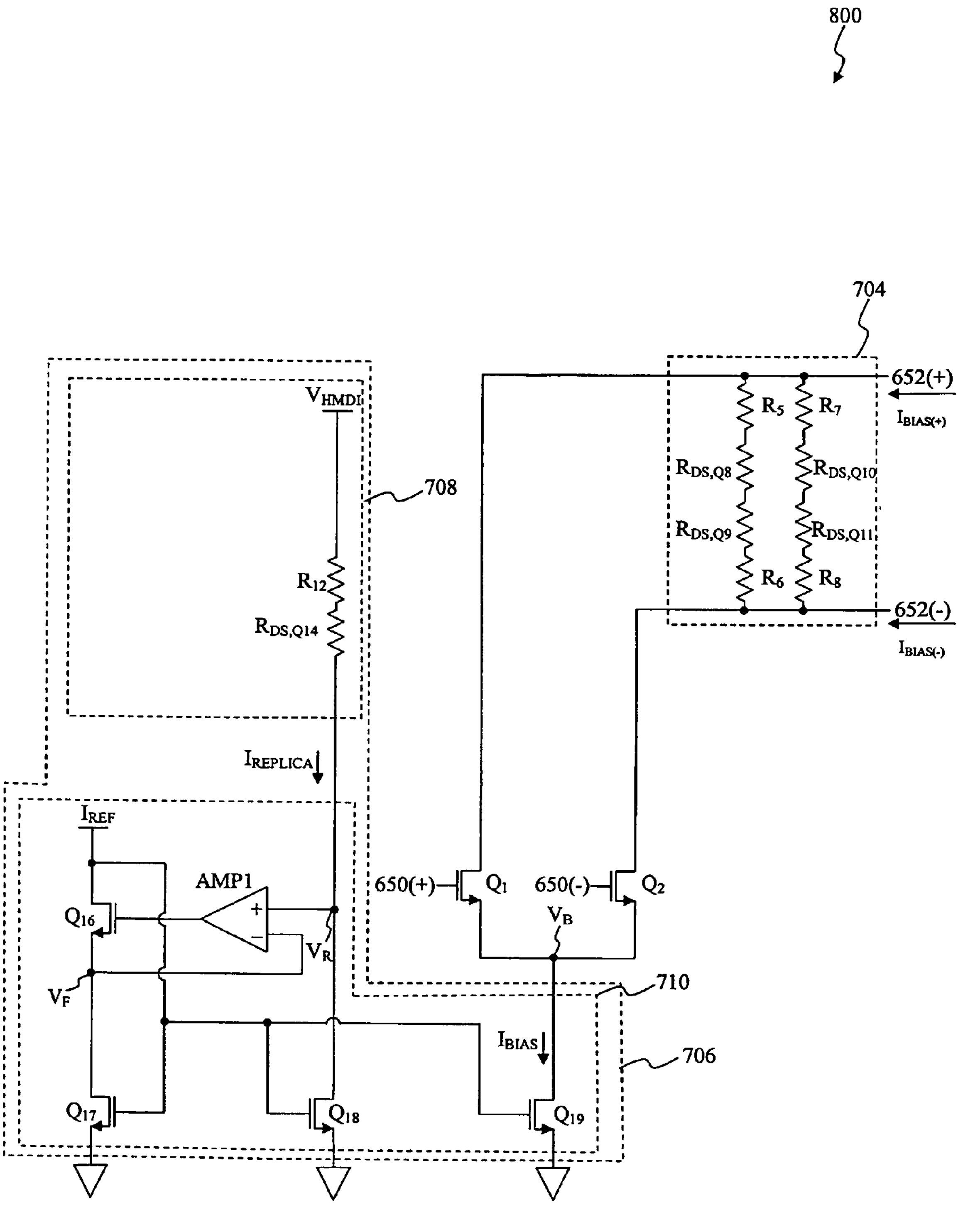

FIG. 8 illustrates a HDMI mode of operation of the HDMI/DisplayPort transmitter used in the Dual HDMI/DisplayPort system architecture according to an exemplary embodiment of the present invention.

Figure 9:
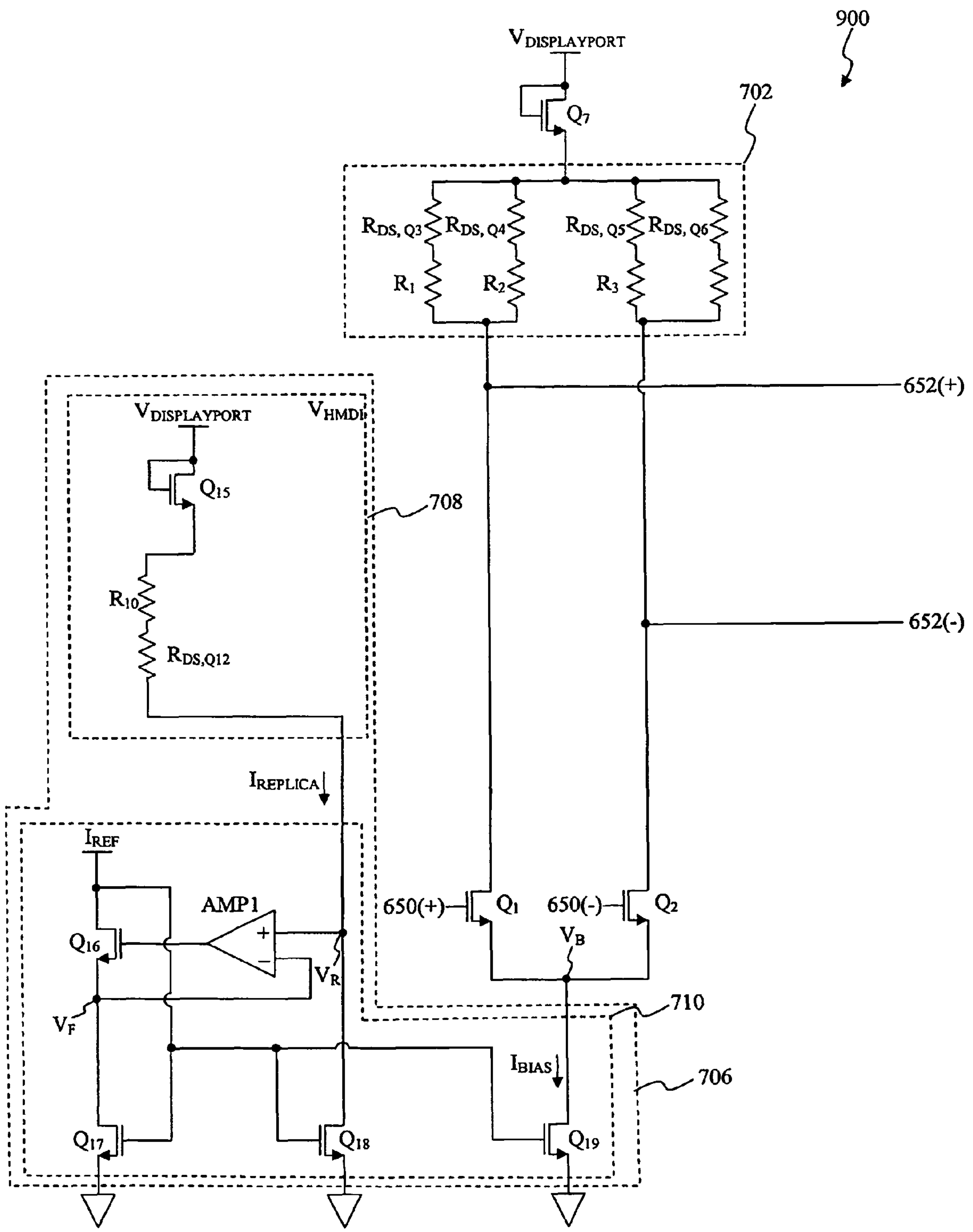

FIG. 9 illustrates a DisplayPort mode A of operation of the HDMI/DisplayPort transmitter used in the Dual HDMI/DisplayPort system architecture according to an exemplary embodiment of the present invention.

Figure 10:
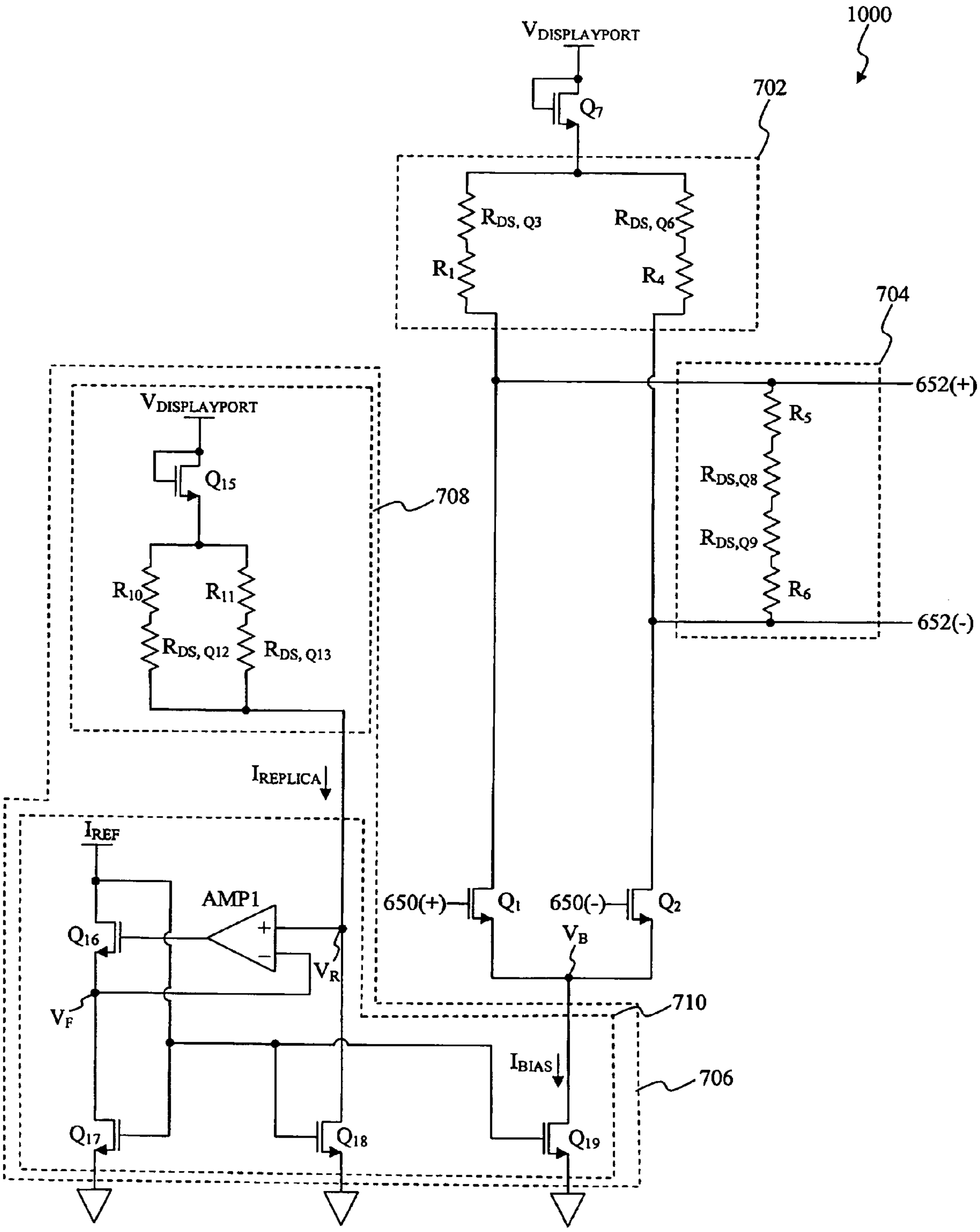

FIG. 10 illustrates a DisplayPort mode B of operation of the HDMI/DisplayPort transmitter used in the Dual HDMI/DisplayPort system architecture according to an exemplary embodiment of the present invention.

Figure 11:
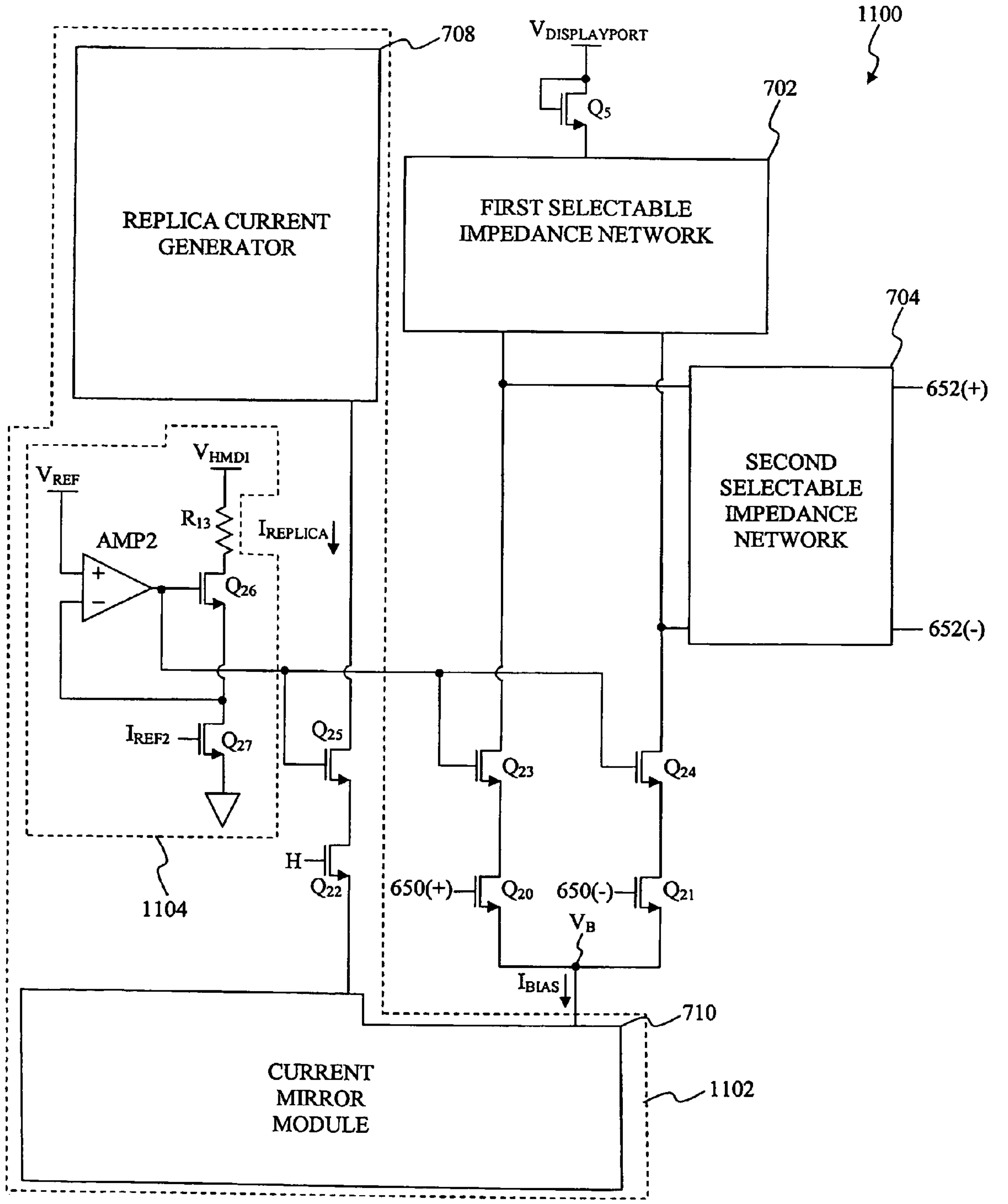

FIG. 11 further illustrates the HDMI/DisplayPort transmitter used in the Dual HDMI/DisplayPort system architecture according to a second exemplary embodiment of the present invention.

Figure 12:
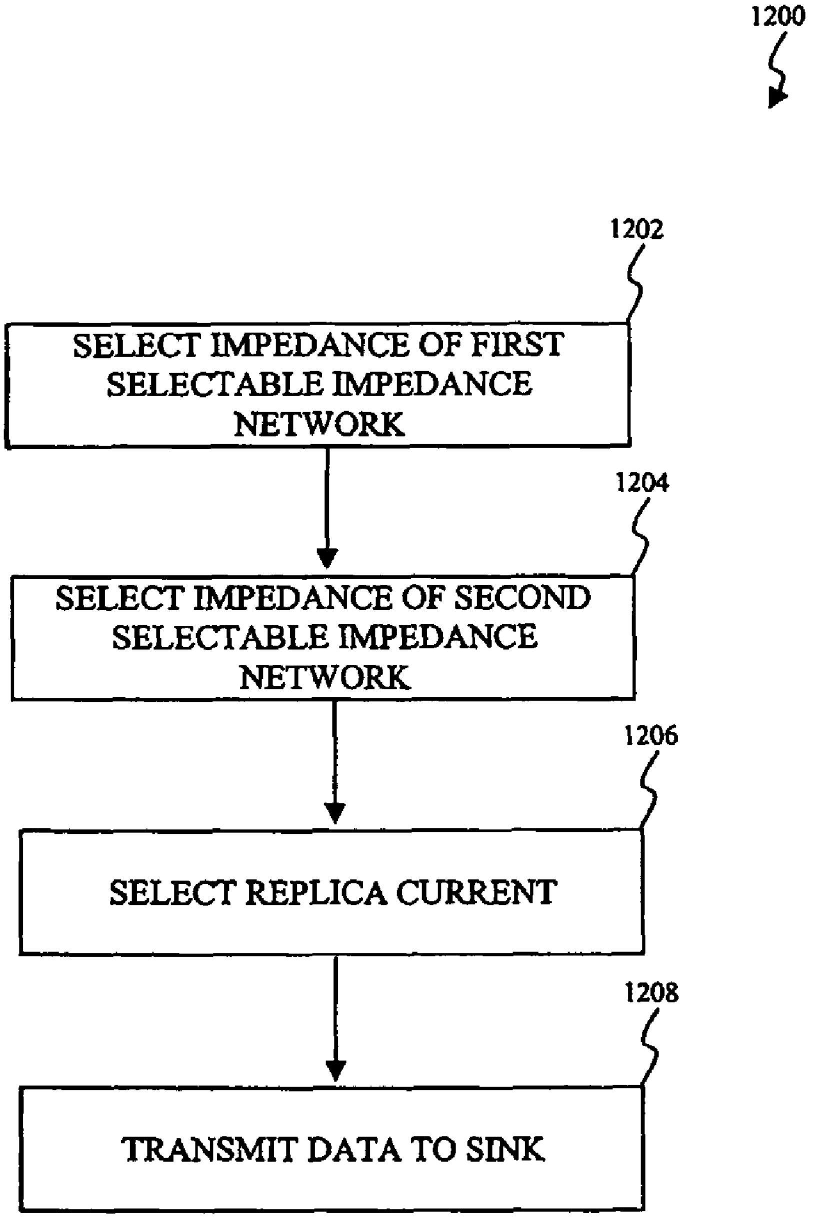

FIG. 12 is a flowchart of exemplary operational steps of the HDMI/DisplayPort transmitter used in the Dual HDMI/DisplayPort system architecture according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present invention. Therefore, the Detailed Description is not meant to limit the present invention. Rather, the scope of the present invention is defined only according to the following claims and their equivalents.

The following Detailed Description of the exemplary embodiments will so fully reveal the general nature of the present invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

High-Definition Multimedia Interface (HDMI)

Figure 1:
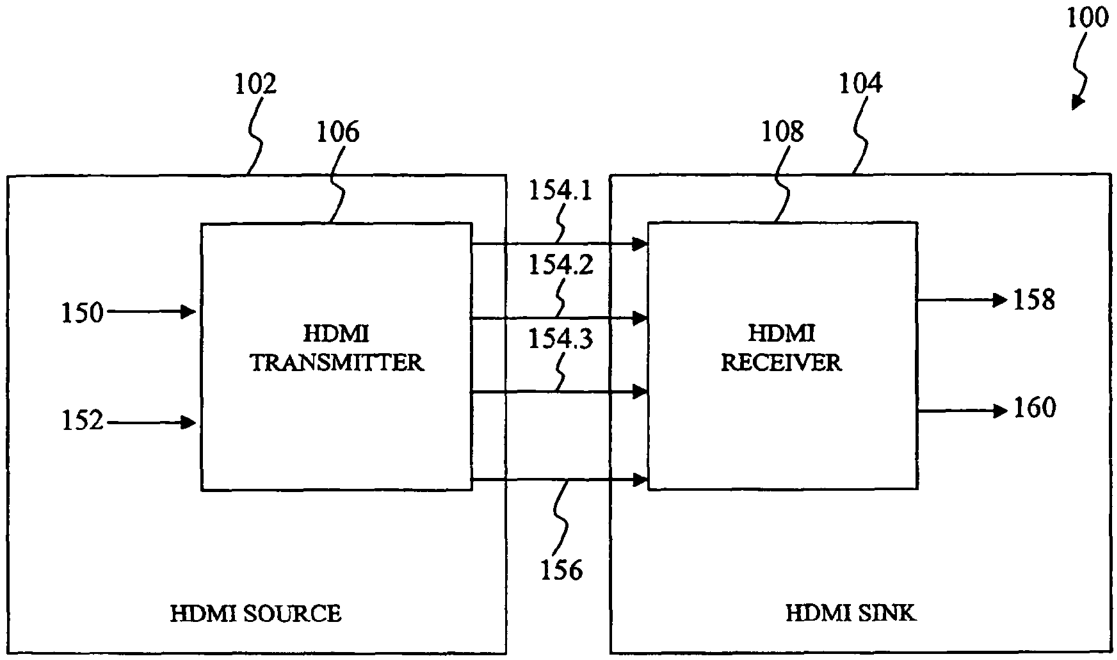
FIG. 1 (PRIOR ART)
FIG. 1 illustrates a conventional High-Definition Multimedia Interface (HDMI) system architecture.

FIG. 1 illustrates a conventional High-Definition Multimedia Interface (HDMI) system architecture. A HDMI system architecture 100 transfers uncompressed digital data representing audio, video, and/or auxiliary data information from a HDMI source 102 to a HDMI sink 104 according to a High-Definition Multimedia Interface Specification (herein "HDMI interface standard"), of which Version 1.3a is the latest, which is incorporated by reference herein in its entirety. The HDMI source 102 may include a set-top box, a Digital Video Disc (DVD) player, a personal computer (PC), a video gaming console, or any other suitable device that includes at least one HDMI output. The HDMI sink 104 may include a digital audio device, a computer monitor, a digital television, or any other suitable device that includes at least one HDMI input.

Referring to FIG. 1, the HDMI source 162 includes a HDMI transmitter 106. The HDMI transmitter 106 receives and transmits at least one of a video signal 150, an audio signal 152, and/or auxiliary data to the HDMI sink 104 via four differential Transition Minimized Differential Signaling (TMDS) output pairs. The auxiliary data may include data describing the video signal 150, the audio signal 152 and/or the HDMI source 102 itself. Three of the four TMDS output pairs, denoted as output data pairs 154.1 through 154.3 are used for transmission of the video signal 150, the audio signal 152, and/or the auxiliary data. One of the four differential TMDS output pairs, denoted as data clock pair 156, is used for transmission of a data clock to be used by the HDMI sink 104 to recover the video, the audio, and/or the auxiliary data information from the output data pairs 154.1 through 154.3.

The HDMI sink 104 includes a HDMI receiver 108. The HDMI receiver 108 receives the output data pairs 154.1 through 154.3 and the data clock pair 156 from the HDMI source 102. The HDMI receiver 108 may recover a video signal 158, an audio signal 160, and/or the auxiliary data from the output data pairs 154.1 through 154.3 based upon the data clock pair 156.

The HDMI system architecture 100, including the HDMI source 102 and the HDMI sink 104, is further defined in the HDMI interface standard.

Figure 2:
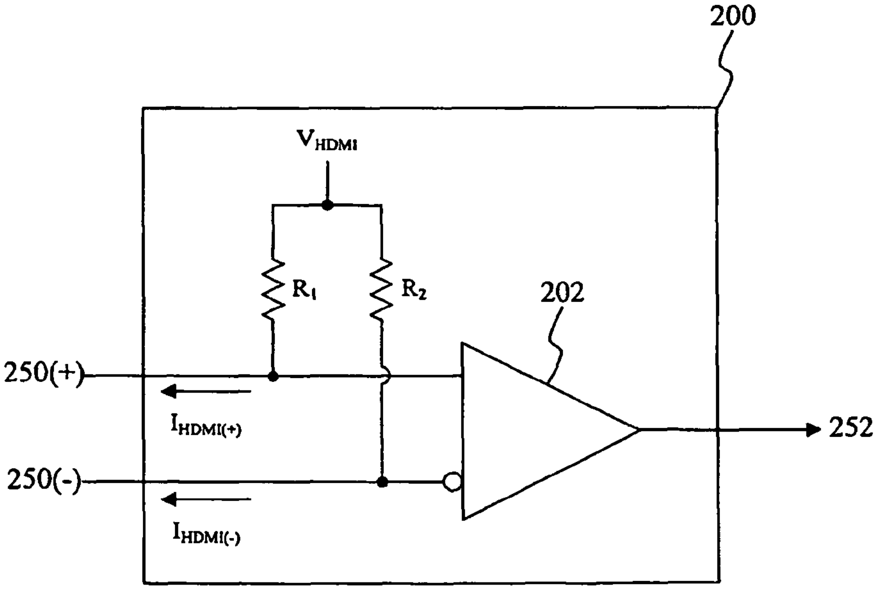
FIG. 2 (PRIOR ART)
FIG. 2 illustrates a conventional HDMI receiver used in the conventional HDMI system architecture.

FIG. 2 illustrates a conventional HDMI receiver used in the conventional HDMI system architecture. TMDS technology uses current drive to develop a low voltage differential signal at a HDMI sink, such as the HDMI sink 104 to provide an example. A HDMI receiver 200 provides a differential HDMI biasing current $I_{HDMI}$, having a first component $I_{HDMI(+)}$ and a second component $I_{HDMI(-)}$, through a transmission line to a HDMI transmitter, such as the HDMI transmitter 106 to provide an example. More specifically, the HDMI receiver 200 provides the differential HDMI biasing current $I_{HDMI}$ from a HDMI voltage source $V_{HDMI}$ within the HDMI receiver 200 itself to the HDMI transmitter. The transmission line carries data via output data pairs, such as the output data pairs 154.1 through 154.3 to provide an example, and a clock via the data clock pair, such the data clock pair 156 to provide an example, from the HDMI source to the HDMI sink.

Referring to FIG. 2, the HDMI receiver 200 includes a differential to single-ended converter 202. The differential to single-ended converter 202 converts a differential input signal 250, including a first component 250(+) and a second component 250(−), to provide a single-ended output signal 252. The differential input signal 250 may represent data from the one of the output data pairs 154.1 through 154.3 or a data clock from the data clock pair 156.

DisplayPort

Figure 3:
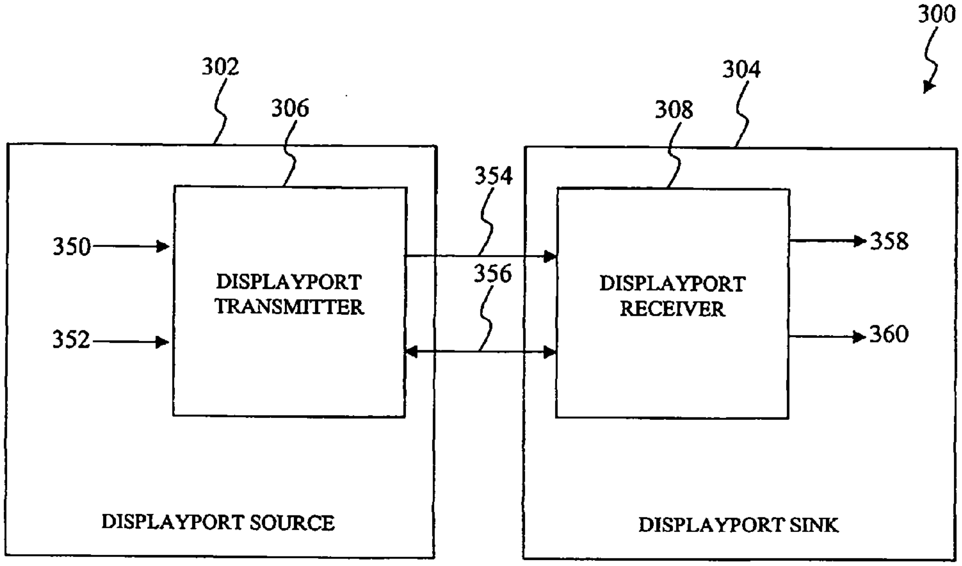
FIG. 3 (PRIOR ART)
FIG. 3 illustrates a conventional DisplayPort system architecture.

FIG. 3 illustrates a conventional DisplayPort system architecture. A DisplayPort system architecture 300 transfers uncompressed digital data representing audio and/or video information from a DisplayPort source 302 to a DisplayPort sink 304 according to the Video Electronics Standards Association (VESA) DisplayPort Standard (herein "DisplayPort interface standard"), of which Version 1, Revision 1a, is the latest, which is incorporated by reference herein in its entirety. The DisplayPort source 302 may include a set-top box, a Digital Video Disc (DVD) player, a personal computer (PC), a video gaming console, or any other suitable device that includes at least one DisplayPort output. The DisplayPort sink 304 may include a digital audio device, a computer monitor, a digital television, or any other suitable device that includes at least one DisplayPort input.

Referring to FIG. 3, the DisplayPort source 302 includes a DisplayPort transmitter 306. The DisplayPort transmitter 306 transmits at least one of a video signal 350 and/or an audio signal 352 to the DisplayPort sink 304 via a Main Link 354. The Main Link 354 may include one, two, or four AC-coupled, doubly terminated differential pairs often referred to as lanes. Unlike the HDMI Source, the DisplayPort source 302 does not dedicate a lane to provide a data clock. The DisplayPort sink 304 extracts the data clock from the data carried by the Main Link 354. The DisplayPort system architecture 300 additionally includes a bi-directional auxiliary channel 356 for management of the Main Link 354 and control of the DisplayPort source 302 and/or the DisplayPort sink 304.

The DisplayPort system architecture 300 includes a DisplayPort receiver 308. The DisplayPort receiver 308 receives data from the Main Link 354 and extracts the data clock from the data carried by the Main Link 354. The DisplayPort receiver 308 may recover at least one of a video signal 358, and/or an audio signal 160 from the Main Link 354.

The DisplayPort system architecture 300 including the DisplayPort source 302 and the DisplayPort sink 304 is further defined in the DisplayPort interface standard.

Figure 4:
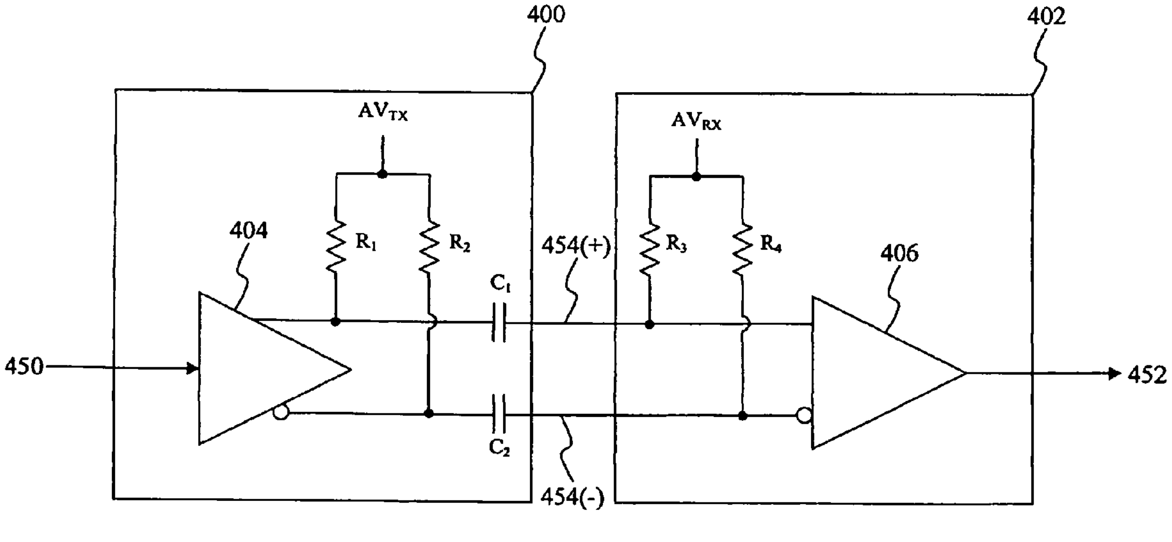
FIG. 4 (PRIOR ART)
FIG. 4 illustrates a conventional DisplayPort transmitter and a conventional DisplayPort receiver used in the conventional DisplayPort system architecture.

FIG. 4 illustrates a conventional DisplayPort transmitter and a conventional DisplayPort receiver used in the conventional DisplayPort system architecture. Unlike the HDMI receiver 200, a DisplayPort receiver 402 is AC-coupled to a DisplayPort transmitter 400. The DisplayPort transmitter 306, as described above, may include one or more DisplayPort transmitters 400. Likewise the DisplayPort receiver 308 may include one or more DisplayPort receivers 402. More specifically, the DisplayPort transmitter 400 includes a first capacitor $C_1$ to AC-couple the first component 454(+) of the differential signal 454 from the DisplayPort transmitter 400 and a second capacitor $C_2$ to AC-couple the second component 454(−) of the differential signal 454 from the DisplayPort transmitter 400.

The AC-coupling of the DisplayPort transmitter 400 and the DisplayPort receiver 402 prevents the DisplayPort receiver 402 from providing a biasing current through a transmission line to the DisplayPort transmitter. Therefore, the DisplayPort transmitter 400 internally provides the biasing current necessary for operation. The transmission line carries data via the Main Link 354 and/or management and control data via the auxiliary channel 356 from the DisplayPort source to the DisplayPort sink.

Referring to FIG. 4, the DisplayPort transmitter 400 includes a single-ended to differential to converter 404. The single-ended to differential to converter 404 converts a single-ended signal 450 to provide the differential signal 454 including a first component 454(+) and a second component 454(−). The differential signal 454 may represent data transmitted to the Main Link 354 and/or management and control data transmitted to the auxiliary channel 356. Likewise, the DisplayPort receiver 402 includes a differential to single-ended converter 406. The differential to single-ended converter 402 converts a differential signal 454, including a first component 454(+) and a second component 454(−), to provide a single-ended output signal 452. The differential input signal 454 may represent data received from the Main Link 354 and/or management and control data received from the auxiliary channel 356.

Dual HDMI/DisplayPort

Figure 5:
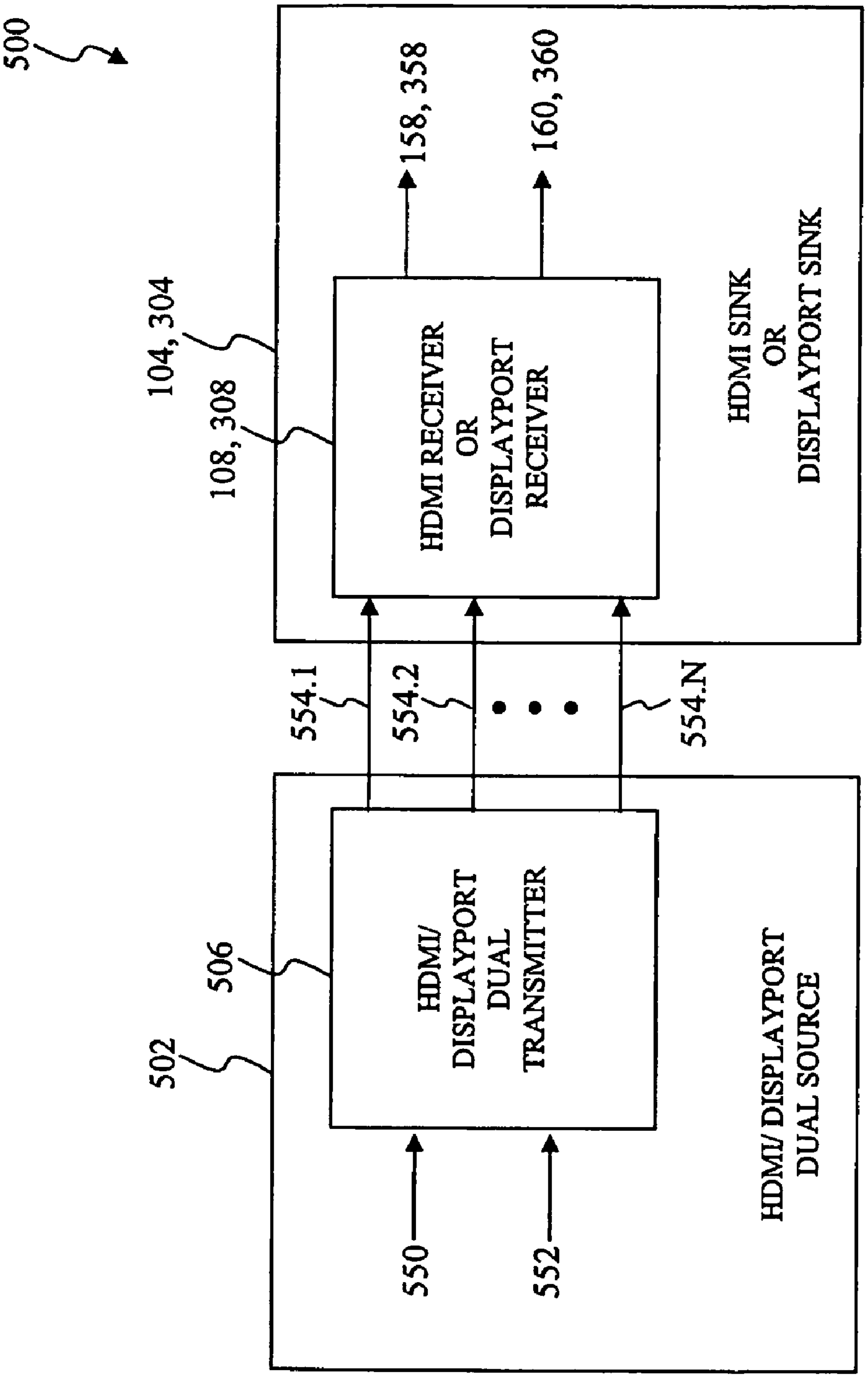
FIG. 5 illustrates a Dual HDMI/DisplayPort system architecture according to an exemplary embodiment of the present invention.

FIG. 5 illustrates a Dual HDMI/DisplayPort system architecture according to an exemplary embodiment of the present invention. A DisplayPort system architecture 500 transfers uncompressed digital data representing audio and/or video information from a HDMI/DisplayPort dual source 502 to a HDMI sink, such as the HDMI sink 104, or a DisplayPort sink, such as the DisplayPort sink 304, according to the HDMI interface standard or the DisplayPort interface standard. In other words, the HDMI/DisplayPort dual source 502 may communicate with any suitable sink device that is configured to operate according to the DisplayPort interface standard and/or the HDMI interface standard. The dual source 502 may include a set-top box, a Digital Video Disc (DVD) player, a personal computer (PC), a video gaming.

Referring to FIG. 5, the HDMI/DisplayPort dual source 502 includes a HDMI/DisplayPort dual transmitter 506. The HDMI/DisplayPort dual transmitter 506 represents a single transmission device that may communicate with any suitable sink device that is configured to operate according to the DisplayPort interface standard and/or the HDMI interface standard. For example, the HDMI/DisplayPort dual transmitter 506 transmits at least one of a video signal 550, and/or an audio signal 552 to the one of the HDMI sink 104 or the DisplayPort sink 304 via N differential output pairs denoted as output data pairs 554.1 through 554.N. For example, the HDMI/DisplayPort dual transmitter 506 may transmit the video signal 550, and/or the audio signal 552 to the HDMI sink via four output pairs according to the HDMI interface standard. Alternatively, the HDMI/DisplayPort dual transmitter 506 may transmit the video signal 550 and/or the audio signal 552 to the DisplayPort sink via one, two, or four output pairs according to the DisplayPort interface standard.

Figure 6:
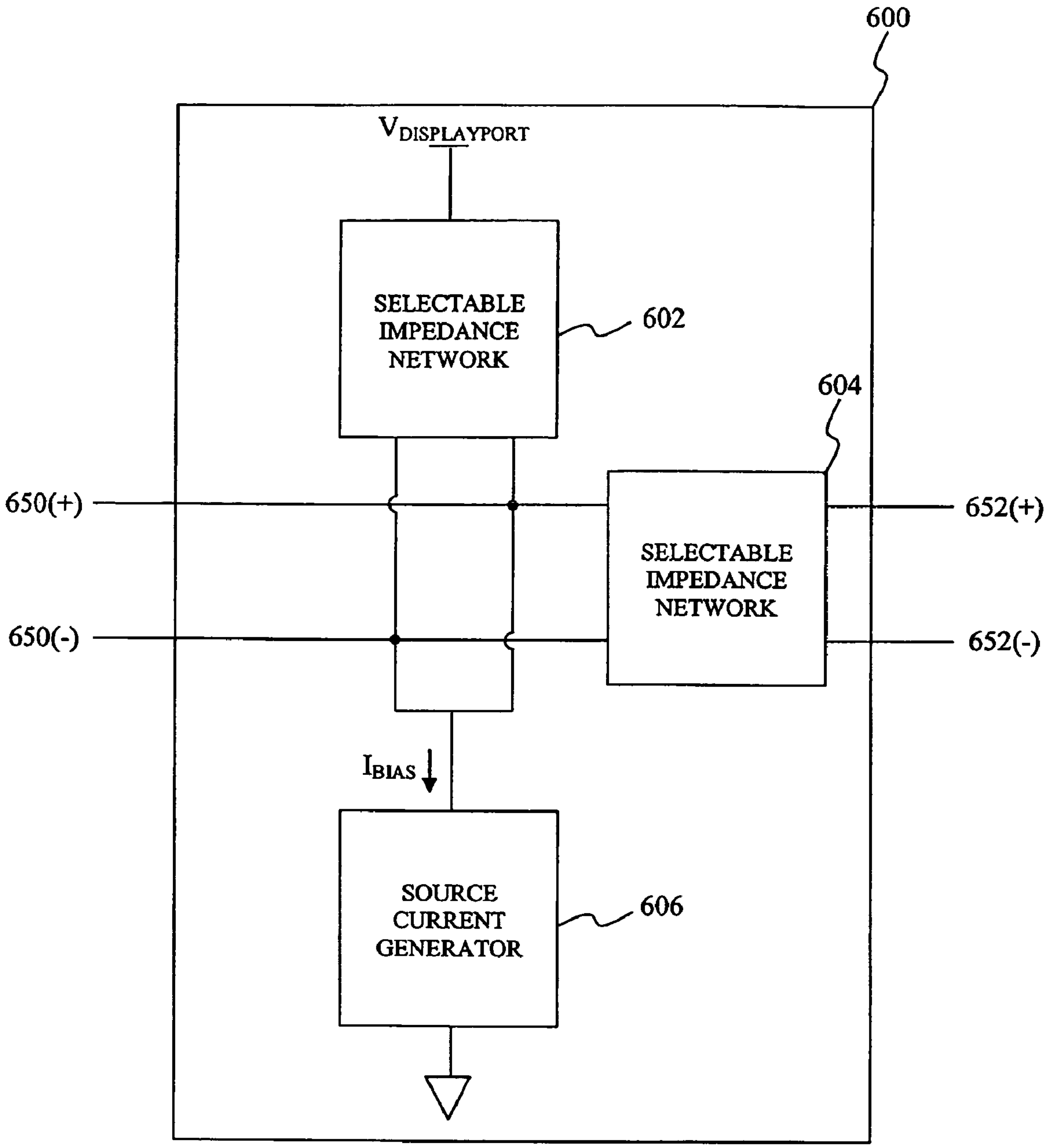
FIG. 6 illustrates a HDMI/DisplayPort transmitter used in the Dual HDMI/DisplayPort system architecture according to an exemplary embodiment of the present invention.

FIG. 6 illustrates a HDMI/DisplayPort transmitter used in the Dual HDMI/DisplayPort system architecture according to an exemplary embodiment of the present invention. An HDMI/DisplayPort dual transmitter, such as the HDMI/DisplayPort dual transmitter 506 to provide an example, may include one HDMI/DisplayPort transmitter 600 for each output data pair. For example, the HDMI/DisplayPort dual transmitter may include four HDMI/DisplayPort transmitters 600 to transmit a video signal, such as the video signal 550, an audio signal, such as the audio signal 552, and/or a data clock according to the HDMI interface standard. Alternatively, the HDMI/DisplayPort dual transmitter may include one, two, or four HDMI/DisplayPort transmitters 600 to transmit the video signal 550, and/or the audio signal 552 according to the DisplayPort interface standard.

The HDMIDisplayPort transmitter 600 may transmit a differential output signal 652, having a first component 652(+) and a second component 652(−), based upon a differential input signal 650, having a first component 650(+) and a second component 650(−), to a HDMI sink, such as the HDMI sink 104, or a DisplayPort sink, such as the DisplayPort sink 304, according to the HDMI interface standard or the DisplayPort interface standard. The differential input signal 650 may represent one or more of the video signal, the audio signal, and/or the data clock according to the HDMI interface standard. Alternatively, the differential input signal 650 may represent one or more of the video signal and/or the audio signal according to the DisplayPort interface standard.

From the discussion above, a HDMI sink, such as the HDMI sink 104 to provide an example, may provide a biasing current $I_{BIAS}$, such as the differential HDMI biasing current $I_{HDMI}$ as described in FIG. 2 to provide an example, to the HDMI/DisplayPort transmitter 600 in an HDMI mode of operation. Alternatively, the HDMI/DisplayPort transmitter 600 may internally provide the biasing current $I_{BIAS}$ in the DisplayPort mode of operation.

The HDMI/DisplayPort transmitter 600 includes a first selectable impedance network 602, a second selectable impedance network 604, and a source current generator 606. The first selectable impedance network 602 and the second selectable impedance network 604 may include any suitable combination of passive elements, such as resistors, capacitors, and inductors to provide some examples that are selectable by the HDMI/DisplayPort transmitter 600. For example, the first selectable impedance network 602 and/or the second selectable impedance network 604 may each include one or more selectable impedances. The HDMI/DisplayPort transmitter 600 may select any one of the selectable impedances or any combination of the selectable impedances depending upon a mode of operation.

For example, in the HDMI mode of operation, the HDMI/DisplayPort transmitter 600 selects a first combination of the selectable impedances in the first selectable impedance network 602 and selects a first combination of the selectable impedances in the second selectable impedance network 604 such that the HDMI/DisplayPort transmitter 600 is configured to be provided with the biasing current $I_{BIAS}$ via the differential output signal 652. The DisplayPort mode of operation includes a high output voltage mode referred to as a DisplayPort mode A of operation and a low output voltage mode referred to as a DisplayPort mode 13 of operation. In the DisplayPort mode A of operation, the HDMI/DisplayPort transmitter 600 selects a second combination of the selectable impedances in the first selectable impedance network 602 and selects a second combination of the selectable impedances in the second selectable impedance network 604 such that the HDMI/DisplayPort transmitter 600 is configured to internally provide the biasing current $I_{BIAS}$ from an operating voltage $V_{DISPLAYPORT}$. Likewise, in the DisplayPort mode B of operation, the HDMI/DisplayPort transmitter 600 selects a third combination of the selectable impedances in the first selectable impedance network 602 and selects a third combination of the selectable impedances in the second selectable impedance network 604 such that the HDMI/DisplayPort transmitter 600 is configured to internally provide the biasing current $I_{BIAS}$ from the operating voltage $V_{DISPLAYPORT}$.

The source current generator 606 determines a magnitude of the biasing current $I_{BIAS}$ that is to be provided by the HDMI/DisplayPort transmitter 600 in the HDMI mode of operation or internally provided by the HDMI/DisplayPort transmitter 600 in the DisplayPort mode of operation. In other words, the source current generator 606 controls the magnitude of the biasing current $I_{BIAS}$ that is to be provided by the HDMI/DisplayPort transmitter 600 in the HDMI mode of operation or internally provided by the HDMI/DisplayPort transmitter 600 in the DisplayPort mode of operation.

FIG. 7 further illustrates the HDMI/DisplayPort transmitter used in the Dual HDMI/DisplayPort system architecture according to an exemplary embodiment of the present invention. A HDMI/DisplayPort transmitter 700 may transmit the differential output signal 652 based upon the differential input signal 650 to a HDMI sink, such as the HDMI sink 104, or a DisplayPort sink, such as the DisplayPort sink 304, according to the HDMI interface standard or the DisplayPort interface standard. The HDMI/DisplayPort transmitter 700 may represent an exemplary embodiment of the HDMI/DisplayPort transmitter 600. The HDMI/DisplayPort transmitter 700 includes a first selectable impedance network 702, a second selectable impedance network 704, and a source current generator 706. The first selectable impedance network 702, the second selectable impedance network 704, and the source current generator 706 may represent exemplary embodiments of the first selectable impedance network 602, the second selectable impedance network 604, and the source current generator 606, respectively.

The first selectable impedance network 702 includes resistors $R_1$ through $R_4$ coupled to a corresponding switch $Q_3$ through $Q_6$. In an exemplary embodiment, the switches $Q_3$ through $Q_6$ are p-type metal oxide silicon (PMOS) transistors. However, this example is not limiting, those skilled in the relevant art(s) may implement the switches $Q_3$ through $Q_6$ differently using n-type metal oxide silicon (NMOS) transistors differently in accordance with the teachings herein without departing from the spirit and scope of the present invention. The first selectable impedance network 702 selectively switches among resistors $R_1$ through $R_4$, or selectively switches one or more combinations of the resistors $R_1$ through $R_4$ depending upon the mode of operation of the HDMI/DisplayPort transmitter 700. Each of the resistors $R_1$ through $R_4$ is coupled to a corresponding switch $Q_3$ through $Q_6$. The resistors $R_1$ through $R_4$ may be switched into or out of the first selectable impedance network 702 by selectively turning on or turning off its corresponding switch $Q_3$ through $Q_6$. A transistor $Q_7$, having its gate coupled to its respective drain, limits a flow back current that may be provided by the differential output signal 652 to the operating voltage $V_{DISPLAYPORT}$ when the operating voltage $V_{DISPLAYPORT}$ is powered down, namely in the HDMI mode of operation. In an exemplary embodiment, the transistor $Q_7$ represents a NMOS transistor formed within a deep n-well. In this exemplary embodiment, the transistor $Q_7$ includes five terminals: a gate, a drain, a source, a body, and a deep n-well. The gate, drain, body, and deep n-well are coupled to the operating voltage $V_{DISPLAYPORT}$ while the source is coupled to the first selectable impedance network 702.

The second selectable impedance network 704 includes resistors $R_5$ through $R_8$ coupled to a corresponding switch $Q_8$ through $Q_{11}$. In an exemplary embodiment, the switches $Q_8$ through $Q_{11}$ are p-type metal oxide silicon (PMOS) transistors. However, this example is not limiting, those skilled in the relevant art(s) may implement the switches $Q_8$ through $Q_{11}$ differently using n-type metal oxide silicon (NMOS) transistors differently in accordance with the teachings herein without departing from the spirit and scope of the present invention. The second selectable impedance network 704 selectively switches among resistors $R_5$ through $R_8$, or selectively switches one or more combinations of the resistors $R_5$ through $R_8$ depending upon the mode of operation of the HDMI/DisplayPort transmitter 700. Each of the resistors $R_5$ through $R_8$ is coupled to a corresponding switch $Q_8$ through $Q_{11}$. The resistors $R_5$ through $R_8$ may be switched into or out of the second selectable impedance network 704 by selectively turning on or turning off its corresponding switch $Q_8$ through $Q_{11}$.

The source current generator 706 is provided with the biasing current $I_{BIAS}$ from the HDMI sink in the HDMI mode of operation or is internally provided with the biasing current $I_{BIAS}$ in the DisplayPort mode of operation. The biasing current $I_{BIAS}$ is used to bias a first transistor $Q_1$ and a second transistor $Q_2$. In an exemplary embodiment, the first transistor $Q_1$ and the second transistor $Q_2$ represent n-type metal oxide silicon (NMOS) transistors. However, this example is not limiting, those skilled in the relevant art(s) may implement the switches $Q_3$ through $Q_6$ differently using p-type metal oxide silicon (PMOS) transistors differently in accordance with the teachings herein without departing from the spirit and scope of the present invention. The first transistor $Q_1$ and the second transistor $Q_2$ may receive the first component 650(+) of the differential input signal 650 and the second component 650(−) of the differential input signal 650, respectively.

As shown in FIG. 7, the source current generator 706 includes a replica current generator 708 and a current mirror module 710. The replica current generator 708 provides a replica current $I_{REPLICA}$ to the current mirror module 710. More specifically, the replica current generator 708 provides the replica current $I_{REPLICA}$ to the current mirror module 710 based upon a first operating voltage $V_{DISPLAYPORT}$, typically $2.5V_{DC}$, and a second operating voltage $V_{HDMI}$, typically $3.3V_{DC}$, by selectively switching among resistors $R_{10}$ through $R_{12}$ or a combination of the resistors $R_{10}$ through $R_{12}$ depending upon the mode of operation of the HDMI/DisplayPort transmitter 700. Each of the resistors $R_{10}$ through $R_{12}$ is coupled to a corresponding switch $Q_{12}$ through $Q_{14}$. The resistors $R_{10}$ through $R_{12}$ may be switched into or out of the replica current generator 708 by selectively turning on or turning off its corresponding switch $Q_{12}$ through $Q_{14}$. A transistor $Q_{15}$, having its gate coupled to its respective drain, limits a flow back current that may be provided by the replica current $I_{REPLICA}$ to the operating voltage $V_{DISPLAYPORT}$ when the operating voltage $V_{DISPLAYPORT}$ is powered down, namely in the HDMI mode of operation. In an exemplary embodiment, the transistor $Q_{15}$ represents a NMOS transistor formed within a deep n-well. In this exemplary embodiment, the transistor $Q_{15}$ includes five terminals: a gate, a drain, a source, a body, and a deep n-well. The gate, drain, body, and deep n-well are coupled to the operating voltage $V_{DISPLAYPORT}$ while the source is coupled to the resistors $R_{10}$ and $R_{11}$.

The current mirror module 710 determines the magnitude of the biasing current $I_{BIAS}$ by mirroring a reference current $I_{REF}$, the replica current $I_{REPLICA}$ and/or the bias current $I_{BIAS}$.

More specifically, the current mirror module 710 ensures that the replica current $I_{REPLICA}$ and/or the bias current $I_{BIAS}$ is proportional to or mirrors the reference current $I_{REF}$. In other words, the current mirror module 710 operates to ensure that a feedback voltage $V_F$, a replica voltage $V_R$, and a bias voltage $V_B$, are substantially equal such that the replica current $I_{REPLICA}$ and/or the bias current $I_{BIAS}$ mirrors the reference current $I_{REF}$. As shown in FIG. 7, the current mirror module 710 includes transistors $Q_{16}$ through $Q_{19}$ and an operational amplifier AMP1.

The operational amplifier AMP1 controls the reference current $I_{REF}$ flowing through the transistor $Q_{16}$ by comparing the replica voltage $V_R$ with the feedback voltage $V_F$. If the replica voltage $V_R$ is not equal to the feedback voltage $V_F$, the operational amplifier AMP1 increases and/or decreases the amount of the reference current $I_{REF}$ flowing through the transistor $Q_{16}$ until the replica voltage $V_R$ is substantially equal to the feedback voltage $V_F$.

The transistor $Q_{17}$ receives the reference current $I_{REF}$ from the transistor $Q_{16}$ as determined by the operational amplifier AMP1. The transistor $Q_{18}$ mirrors the transistor $Q_{17}$ such that a current flowing through the transistor $Q_{18}$ is proportional to a current flowing through the transistor $Q_{17}$. In other words, the current flowing through the transistor $Q_{18}$ mirrors the current flowing through the transistor $Q_{17}$ such that the replica voltage $V_R$ is substantially equal to the feedback voltage $V_F$. In an exemplary embodiment, the transistor $Q_{17}$ has a width that is twice a width of the transistor $Q_{18}$ such that approximately twice as much current flows through the transistor $Q_{17}$ when compared with the transistor $Q_{18}$.

The transistor $Q_{19}$ mirrors the current flowing through the transistor $Q_{17}$ and/or the transistor $Q_{18}$ such that the current flowing through the transistor $Q_{17}$ and/or the transistor $Q_{18}$ is proportional to a current flowing through the transistor $Q_{19}$. In other words, the current flowing through the transistor $Q_{19}$ mirrors the current flowing through the transistor $Q_{17}$ and/or the transistor $Q_{18}$ such that the replica voltage $V_R$, the feedback voltage $V_F$, and the replica voltage $V_R$ are substantially equal. In an exemplary embodiment, the transistor $Q_{19}$ has a programmable width.

FIG. 8 illustrates a HDMI mode of operation of the HDMI/DisplayPort transmitter used in the Dual HDMI/DisplayPort system architecture according to an exemplary embodiment of the present invention. More specifically, FIG. 8 illustrates a HDMI/DisplayPort transmitter 800 configured to operate in the HDMI mode of operation. The HDMI/DisplayPort transmitter 800 may represent an exemplary embodiment of the HDMI/DisplayPort transmitter 700 configured to operate in the HDMI mode of operation.

As shown in FIG. 8, in the first selectable impedance network 702, the switches $Q_3$ through $Q_6$ may be turned off via the control lines A and B such that the first selectable impedance network 702 is turned off in its entirety in the HDMI mode of operation. In the second selectable impedance network 704, the switches $Q_8$ through $Q_{11}$ may be turned on via control lines F and G. $R_{DS,Q8}$ through $R_{DS,Q11}$ represent a drain to source resistance of the switches $Q_8$ through $Q_{11}$, when turned on. This combination of the first selectable impedance network 702 and the second selectable impedance network 704 allows the biasing current $I_{BIAS}$ to be provided to the source current generator 706 by the HDMI sink. In the replica current generator 708, the switch $Q_{14}$ is turned on via a control line E and switches $Q_{12}$ and $Q_{13}$ are turned off via control lines C and D. $R_{DS,Q14}$ represents a drain to source resistance of the switch $Q_{14}$, when turned on. The replica current generator 708 provides the replica current $I_{REPLICA}$ to the current mirror 710. The current mirror 710 causes the biasing current $I_{BIAS}$ and the replica current $I_{REPLICA}$ to be proportional to the reference current $I_{REF}$.

FIG. 9 illustrates a DisplayPort mode A of operation of the HDMI/DisplayPort transmitter used in the Dual HDMI/DisplayPort system architecture according to an exemplary embodiment of the present invention. More specifically, FIG. 9 illustrates a HDMI/DisplayPort transmitter 900 configured to operate in the DisplayPort mode A of operation according to the DisplayPort interface standard. The HDMI/DisplayPort transmitter 900 may represent an exemplary embodiment of the HDMI/DisplayPort transmitter 700 configured to operate in the DisplayPort mode A of operation.

As shown in FIG. 9, in the first selectable impedance network 702, the switches $Q_3$ through $Q_6$ may be turned on via the control lines A and B in the DisplayPort mode A of operation. $R_{DS,Q3}$ through $R_{DS,Q6}$ represent a drain to source resistance of the switches $Q_3$ through $Q_6$, when turned on. In the second selectable impedance network 704, the switches $Q_8$ through $Q_{11}$ may be turned off via control lines F and G such that the second selectable impedance network 704 is turned off in its entirety. This combination of the first selectable impedance network 702 and the second selectable impedance network 704 allows the biasing current $I_{BIAS}$ to be internally provided to the source current generator 706. In the replica current generator 708, the switch $Q_{12}$ is turned on via a control line C and switches $Q_{13}$ and $Q_{14}$ are turned off via control lines D and E. $R_{DS,Q12}$ represents a drain to source resistance of the switches $Q_{12}$, when turned on. The current mirror 710 causes the biasing current $I_{BIAS}$ and the replica current $I_{REPLICA}$ to be proportional to the reference current $I_{REF}$.

FIG. 10 illustrates a DisplayPort mode B of operation of the HDMI/DisplayPort transmitter used in the Dual HDMI/DisplayPort system architecture according to an exemplary embodiment of the present invention. More specifically, FIG. 10 illustrates a HDMI/DisplayPort transmitter 1000 configured to operate in the DisplayPort mode B of operation according to the DisplayPort interface standard. The HDMI/DisplayPort transmitter 1000 may represent an exemplary embodiment of the HDMI/DisplayPort transmitter 700 configured to operate in the DisplayPort mode B of operation.

As shown in FIG. 10, in the first selectable impedance network 702, the switches $Q_3$ and $Q_6$ may be turned on via the control line A and the switches $Q_4$ and $Q_5$ may be turned off via the control line B in the DisplayPort mode B of operation. $R_{DS,Q3}$ and $R_{DS,Q6}$ represent a drain to source resistance of the switches $Q_3$ and $Q_6$, when turned on. In the second selectable impedance network 704, the switches $Q_8$ through $Q_9$ may be turned on via control line F and the switches $Q_{10}$ through $Q_{11}$ may be turned off via control line F and G. $R_{DS,Q8}$ and $R_{DS,Q9}$ represent a drain to source resistance of the switches $Q_8$ and $Q_9$, when turned on. This combination of the first selectable impedance network 702 and the second selectable impedance network 704 allows the biasing current $I_{BIAS}$ to be internally provided to the source current generator 706. In the replica current generator 708, the switches $Q_{12}$ and $Q_{13}$ are turned on via a control lines C and D and the switches $Q_{14}$ is turned off via control line E. $R_{DS,Q12}$ and $R_{DS,Q13}$ represent a drain to source resistance of the switches $Q_{12}$ and $Q_{13}$, when turned on. The current mirror 710 causes the biasing current $I_{BIAS}$ and the replica current $I_{REPLICA}$ to be proportional to the reference current $I_{REF}$.

FIG. 11 further illustrates the HDMIDisplayPort transmitter used in the Dual HDMI/DisplayPort system architecture according to a second exemplary embodiment of the present invention. A HDMI/DisplayPort transmitter 1100 is substantially similar to the HDMI/DisplayPort transmitter 700 as described above. Therefore, only differences between the HDMI/DisplayPort transmitter 700 and the HDMI/DisplayPort transmitter 1100 are to be described in further detail.

The HDMI/DisplayPort transmitter 1100 includes thin oxide transistors $Q_{20}$ through $Q_{22}$ and thick oxide transistors $Q_{23}$ through $Q_{25}$, the thick oxide transistors $Q_{23}$ through $Q_{25}$ being formed with a thicker gate oxide when compared with a gate oxide of the thin oxide transistors $Q_{20}$ through $Q_{22}$. This combination of thin oxide and thick oxide transistors provides the HDMI/DisplayPort transmitter 1100 with a greater speed when compared to the HDMI/DisplayPort transmitter 700 that only includes the transistors $Q_1$ and $Q_2$. More specifically, the thinner gate oxide of the thin oxide transistors $Q_{20}$ through $Q_{22}$ allows the thin oxide transistors $Q_{20}$ through $Q_{22}$ to tarn off and/or on at faster rate when compared to the transistors $Q_1$ and $Q_2$ of the HDMI/DisplayPort transmitter 700. However, the first operating voltage $V_{DISPLAYPORT}$ and/or the second operating voltage $V_{HDMI}$ may exceed a breakdown voltage of the thin oxide transistors $Q_{20}$ through $Q_{22}$. The thick oxide transistors $Q_{23}$ through $Q_{25}$ prevent the thin oxide transistors $Q_{20}$ through $Q_{22}$ from exceeding their respective breakdown voltages. It should be noted that the thin oxide transistor $Q_{22}$ and the thick oxide transistor $Q_{25}$ allow the HDMI/DisplayPort transmitter 1100 to better mirror the reference current $I_{REF}$.

The HDMI/DisplayPort transmitter 1100 includes a source current generator 1102. The source generator 1102 includes a biasing module 1104 in addition to the replica current generator 708 and the current mirror module 710 as described above. The biasing module 1104 provides a fixed biasing current to the thick oxide transistors $Q_{23}$ through $Q_{25}$. The biasing module 1104 includes a resistor R13, transistors $Q_{26}$ and $Q_{27}$, and an operational amplifier AMP2. The operational amplifier AMP2 provides the fixed biasing current by comparing a fixed reference voltage $V_{REF}$ with a voltage between a source of the transistor $Q_{26}$ and a drain of the transistor $Q_{27}$. A biasing of the transistor $Q_{26}$ is controlled by an output of the operational amplifier AMP2 while a biasing of the transistor $Q_{27}$ is controlled by a fixed reference current $I_{REF2}$. A current, dependent on the biasing of the transistors $Q_{26}$ and $Q_{27}$, flows from the second operating voltage $V_{HDMI}$ flows through the resistor R13 and transistors $Q_{26}$ and $Q_{27}$.

The HDMI/DisplayPort transmitter 1100 may be configured to operate in the HDMI mode of operation, the DisplayPort mode A of operation, and the DisplayPort mode B of operation as discussed in FIG. 8 through FIG. 10.

FIG. 12 is a flowchart of exemplary operational steps of the HDMI/DisplayPort transmitter used in the Dual HDMI/DisplayPort system architecture according to an exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 12.

At step 1202, an impedance of a first selectable impedance network is selected. The first selectable impedance network, such as the first selectable impedance network 602 to provide an example, includes one or more selectable impedances. Any one of the selectable impedances of the first selectable impedance network or any combination of the selectable impedances may be selected depending upon a mode of operation. For example, step 1202 may select a first impedance from among the selectable impedances in the HDMI mode of operation and a second impedance from among the selectable impedances in the DisplayPort mode of operation.

At step 1204, an impedance of a second selectable network is selected. The second selectable network, such as the second selectable impedance network 602 to provide an example, includes one or more selectable impedances. Any one of the selectable impedances of the second selectable network or any combination of the selectable impedances may be selected depending upon the mode of operation. For example, step 1204 may select a first impedance from among the selectable impedances in the HDMI mode of operation and a second impedance from among the selectable impedances in the DisplayPort mode of operation.

At step 1206, a replica current, such as the replica current $I_{REPLICA}$ to provide an example, corresponding to the HDMI mode of operation or the DisplayPort mode of operation is produced. The replica current is configured to replicate a biasing current, such as the biasing current $I_{BIAS}$, that may be externally provided by a HDMI sink, such as the HDMI sink 104 to provide an example, or internally generated depending upon the mode of operation. A replica current generator, such as the replica current generator 710 to provide an example, may be used to provide the replica current. The replica current is proportional to or mirrors a reference current, such as the reference current $I_{REF}$ to provide an example. In other words, the replica current mirrors the reference current such that ultimately the biasing current mirrors the reference current as well.

At step 1208, data is received by a data transmitter, such as the HDMI/DisplayPort transmitter 600, the HDMI/DisplayPort transmitter 700, and or the HDMI/DisplayPort transmitter 1100 to provide some examples. The data transmitter transmits the data to the HDMI sink according to the HDMI interface standard or to a DisplayPort sink, such as the DisplayPort sink 304, according to the DisplayPort interface standard.

Conclusion

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail may be made therein without departing from the spirit and scope of the present invention. Thus, the present invention should not be limited by any of the above-described exemplary embodiments, but should be defined only according to the following claims and their equivalents.

What is claimed is:

1. A dual mode transmitter configurable to operate in one of a High-Definition Multimedia Interface (HDMI) mode of operation and a DisplayPort mode of operation, comprising:

a first selectable impedance network configured to select a first impedance from among a first plurality of impedances in the HDMI mode of operation and a second impedance from among the first plurality of impedances in the DisplayPort mode of operation;

a second selectable impedance network configured to select a first impedance from among a second plurality of impedances in the HDMI mode of operation and a second impedance from among the second plurality of impedances in the DisplayPort mode of operation; and a source current generator configured to receive a bias current from the first selectable impedance network in the DisplayPort mode of operation or from the second selectable impedance network in the HDMI mode of operation, the bias current being used to transmit audio and video information according to a HDMI interface standard in the HDMI mode of operation and to transmit the audio and video information according to a DisplayPort interface standard in the DisplayPort mode of operation.

2. The dual mode transmitter of claim 1, wherein the first selectable impedance network comprises:

a first resistor coupled to a first switch; and a second resistor coupled to a second switch, the second resistor and the second switch being arranged in parallel with the first resistor and the first switch, wherein the first selectable impedance is configurable to select the first resistor as the first impedance by turning on the first switch and turning off the second switch and to select the second resistor as the second impedance by turning off the first switch and turning on the second switch.

3. The dual mode transmitter of claim 2, wherein at least one of a group consisting of: the first switch and the second switch comprises:

a p-type metal oxide silicon (PMOS) transistor.

4. The dual mode transmitter of claim 1, wherein the second selectable impedance network comprises:

a first resistor coupled to a first switch; and a second resistor coupled to a second switch, the second resistor and the second switch being arranged in parallel with the first resistor and the first switch, wherein the second selectable impedance is configurable to select the first resistor as the first impedance by turning on the first switch and turning off the second switch and to select the second resistor as the second impedance by turning off the first switch and turning on the second switch.

5. The dual mode transmitter of claim 4, wherein at least one of a group consisting of: the first switch and the second switch comprises:

a p-type metal oxide silicon (PMOS) transistor.

6. The dual mode transmitter of claim 1, wherein the source current generator comprises:

a replica current generator configured to provide a replica current, the replica current being a replica of the bias current; and a current mirror module configured to receive a reference current, the current mirror module being configured to ensure that the replica current and the bias current is proportional to the reference current.

7. The dual mode transmitter of claim 6, wherein the replica current generator comprises:

a first resistor coupled to a first switch; and a second resistor coupled to a second switch, the second resistor and the second switch being arranged in parallel with the first resistor and the first switch, wherein the replica current generator is configurable to provide the replica current by turning on the first switch and turning off the second switch to select the first resistor in the HDMI mode of operation and turning off the first switch and turning on the second switch to select the second resistor in the DisplayPort mode of operation.

8. The dual mode transmitter of claim 7, wherein the current mirror module comprises:

a first transistor having a first voltage at its respective drain; and a second transistor having second voltage at its respective drain, wherein the current mirror module is configured to operate to ensure that the first voltage is substantially equal to the second voltage, the replica current and the bias current being proportional to the reference current when the first voltage is substantially equal to the second voltage.

9. The dual mode transmitter of claim 8, wherein the current mirror module comprises:

a third transistor having a third voltage at is respective drain, wherein the current mirror module is configured to operate to ensure that the first voltage, the second voltage and the third voltage are substantially equal, the replica current and the bias current being proportional to the reference current when the first voltage, the second voltage and the third voltage are substantially equal.

10. The dual mode transmitter of claim 1, wherein the first selectable impedance network is configured to internally generate the bias current from an operating voltage in the DisplayPort mode of operation.

11. The dual mode transmitter of claim 1, wherein the second selectable impedance network is configured to receive the bias current from a HDMI sink in the HDMI mode of operation.

12. The dual mode transmitter of claim 1, wherein the bias current is used to transmit audio and video information to a HDMI sink in the HDMI mode of operation and to transmit the audio and video information to a DisplayPort sink in the DisplayPort mode of operation.

13. The dual mode transmitter of claim 1, wherein the transmit audio and video information includes a first component and a second component, further comprising:

a first transistor configured to transmit the first component of the audio and video information using the bias current; and a second transistor configured to transmit the second component of the audio and video information using the bias current.

14. A dual mode source device configurable to operate in one of a High-Definition Multimedia Interface (HDMI) mode of operation and a DisplayPort mode of operation, comprising:

a HDMI/DisplayPort dual transmitter module including one or more HDMI/DisplayPort transmitters, each of the HDMI/DisplayPort transmitters including:

a first selectable impedance network configured to select a first impedance from among a first plurality of impedances in the HDMI mode of operation and a second impedance from among the first plurality of impedances in the DisplayPort mode of operation, a second selectable impedance network configured to select a first impedance from among a second plurality of impedances in the HDMI mode of operation and a second impedance from among the second plurality of impedances in the DisplayPort mode of operation, and a source current generator configured to receive a bias current from the first selectable impedance network in the DisplayPort mode of operation or from the second selectable impedance network in the HDMI mode of operation, the bias current being used to transmit audio and video information according to a HDMI interface standard in the HDMI mode of operation and to transmit the audio and video information according to a DisplayPort interface standard in the DisplayPort mode of operation.

15. The dual mode source device of claim 14, wherein the first selectable impedance network comprises:

a first resistor coupled to a first switch; and a second resistor coupled to a second switch, the second resistor and the second switch being arranged in parallel with the first resistor and the first switch, wherein the first selectable impedance is configurable to select the first resistor as the first impedance by turning on the first switch and turning off the second switch and to select the second resistor as the second impedance by turning off the first switch and turning on the second switch.

16. The dual mode source device of claim 15, wherein at least one of a group consisting of: the first switch and the second switch comprises:

a p-type metal oxide silicon (PMOS) transistor.

17. The dual mode source device of claim 14, wherein the second selectable impedance network comprises:

a first resistor coupled to a first switch; and a second resistor coupled to a second switch, the second resistor and the second switch being arranged in parallel with the first resistor and the first switch, wherein the second selectable impedance is configurable to select the first resistor as the first impedance by turning on the first switch and turning off the second switch and to select the second resistor as the second impedance by turning off the first switch and turning on the second switch.

18. The dual mode source device of claim 17, wherein at least one of a group consisting of: the first switch and the second switch comprises:

a p-type metal oxide silicon (PMOS) transistor.

19. The dual mode source device of claim 14, wherein the source current generator comprises:

a replica current generator configured to provide a replica current, the replica current being a replica of the bias current; and a current mirror module configured to receive a reference current, the current mirror module being configured to ensure that the replica current and the bias current is proportional to the reference current.

20. The dual mode source device of claim 19, wherein the replica current generator comprises:

a first resistor coupled to a first switch; and a second resistor coupled to a second switch, the second resistor and the second switch being arranged in parallel with the first resistor and the first switch, wherein the replica current generator is configurable to provide the replica current by turning on the first switch and turning off the second switch to select the first resistor in the HDMI mode of operation and turning off the first switch and turning on the second switch to select the second resistor in the DisplayPort mode of operation.

21. The dual mode source device of claim 19, wherein the current mirror module comprises:

a first transistor having a first voltage at its respective drain; and a second transistor having second voltage at its respective drain, wherein the current mirror module is configured to operate to ensure that the first voltage is substantially equal to the second voltage, the replica current and the bias current being proportional to the reference current when the first voltage is substantially equal to the second voltage.

22. The dual mode source device of claim 21, wherein the current mirror module comprises:

a third transistor having a third voltage at is respective drain, wherein the current mirror module is configured to operate to ensure that the first voltage, the second voltage and the third voltage are substantially equal, the replica current and the bias current being proportional to the reference current when the first voltage, the second voltage and the third voltage are substantially equal.

23. The dual mode source device of claim 14, wherein the first selectable impedance network is configured to internally generate the bias current from an operating voltage in the DisplayPort mode of operation.

24. The dual mode source device of claim 14, wherein the second selectable impedance network is configured to receive the bias current from a HDMI sink in the HDMI mode of operation.

25. The dual mode source device of claim 14, wherein the bias current is used to transmit audio and video information to a HDMI sink in the HDMI mode of operation and to transmit the audio and video information to a DisplayPort sink in the DisplayPort mode of operation.

26. The dual mode source device of claim 14, wherein the transmit audio and video information includes a first component and a second component, further comprising:

a first transistor configured to transmit the first component of the audio and video information using the bias current; and a second transistor configured to transmit the second component of the audio and video information using the bias current.

* * * * *

UNITED STATES PATENT AND TRADEMARK OFFICE

CERTIFICATE OF CORRECTION

PATENT NO. : 8,242,803 B2
APPLICATION NO. : 12/457986
DATED : August 14, 2012
INVENTOR(S) : Wu et al.

It is certified that error appears in the above-identified patent and that said Letters Patent is hereby corrected as shown below:

In the Claims:

Column 13, Line 56, Claim 6
Please replace "current is" with --current are--.

Column 14, Line 17, Claim 9
Please replace "at is respective" with --at its respective--.

Column 15, Line 52, Claim 19
Please replace "current is" with --current are--.

Column 16, Line 25, Claim 22
Please replace "at is respective" with --at its respective--.

Signed and Sealed this
Fourteenth Day of May, 2013

Teresa Stanek Rea
*Acting Director of the United States Patent and Trademark Office*